United States Patent
Plevridis (10) Patent No.: US 8,135,430 B2
(45) Date of Patent: Mar. 13, 2012

(54) METHOD AND SYSTEM FOR WCDMA POWER AMPLIFIER CLOSED LOOP POWER CONTROL

(75) Inventor: Sofoklis Plevridis, Glyfada (GR)

(73) Assignee: Broadcom Corporation, Irvine, CA (US)

( * ) Notice: Subject to any disclaimer, the term of this patent is extended or adjusted under 35 U.S.C. 154(b) by 600 days.

(21) Appl. No.: 12/325,771

(22) Filed: Dec. 1, 2008

(65) Prior Publication Data

US 2010/0136935 A1     Jun. 3, 2010

(51) Int. Cl.
*H04B 7/00* (2006.01)
(52) U.S. Cl. ............... 455/522; 455/77; 455/126
(58) Field of Classification Search ............ 455/77, 455/126, 522
See application file for complete search history.

(56) References Cited

U.S. PATENT DOCUMENTS 7,738,904 B1 *   6/2010   Chien et al. ............ 455/522

* cited by examiner

*Primary Examiner* — Lincoln Donovan
*Assistant Examiner* — John Poos
(74) *Attorney, Agent, or Firm* — Sterne, Kessler, Goldstein & Fox PLLC (57) ABSTRACT

Methods and systems for WCDMA power amplifier closed loop power control are disclosed and may include determining a magnitude of an output RF signal generated by a power amplifier (PA), and configuring a gain of a PGA coupled to an input of the PA via closed-loop feedback to maintain a desired magnitude of the output RF signal. The closed-loop feedback architecture may include a slot-based and/or a real time-based control. A signal proportional to the output signal may be generated by an envelope detector. The signal generated by the envelope detector may be utilized to generate a root-mean-squared (RMS) value. The gain of the PGA may be configured by comparing the RMS value to a desired magnitude of the output signal over a time slot and/or utilizing a real time error signal generated by subtracting the signal proportional to the magnitude of the output signal from a desired magnitude.

30 Claims, 6 Drawing Sheets

METHOD AND SYSTEM FOR WCDMA POWER AMPLIFIER CLOSED LOOP POWER CONTROL

CROSS-REFERENCE TO RELATED APPLICATIONS/INCORPORATION BY REFERENCE

This application makes reference to:
U.S. patent application Ser. No. 12/325,715 filed on Dec. 1, 2008;
U.S. patent application Ser. No. 12/427,564 filed on Apr. 21, 2009; and
U.S. patent application Ser. No. 12/325,750 filed on Dec. 1, 2008.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for WCDMA power amplifier closed loop power control.

BACKGROUND OF THE INVENTION

Mobile communications have changed the way people communicate and mobile phones have been transformed from a luxury item to an essential part of every day life. The use of mobile phones today is dictated by social situations, rather than hampered by location or technology. While voice connections fulfill the basic need to communicate, and mobile voice connections continue to filter even further into the fabric of every day life, various integrated mobile multimedia applications, utilizing the mobile Internet, may be the next step in the mobile communication revolution.

Third generation (3G) cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, and peripheral interface support. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) will become even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for WCDMA power amplifier closed loop power control, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for WCDMA power amplifier closed loop power control. Exemplary aspects of the invention may comprise determining a magnitude of an output RF signal generated by a power amplifier (PA), and configuring a gain of a programmable gain amplifier (PGA) coupled to an input of the PA via closed-loop feedback to maintain a desired magnitude of the output RF signal. The closed-loop feedback architecture may comprise a slot-based and/or a real time-based control. A signal proportional to the magnitude of the output RF signal may be generated by an envelope detector, which may comprise a diode. The signal generated by the envelope detector may be filtered and may be utilized to generate a root-mean-squared (RMS) value. The gain of the PGA may be configured by comparing the RMS value to a desired magnitude of the RF output signal over a time slot. A real time error signal may be generated by subtracting the signal proportional to the magnitude of the output RF signal from a desired magnitude of the output RF signal. The gain of the PGA may be configured utilizing the real time error signal.

Figure 1:
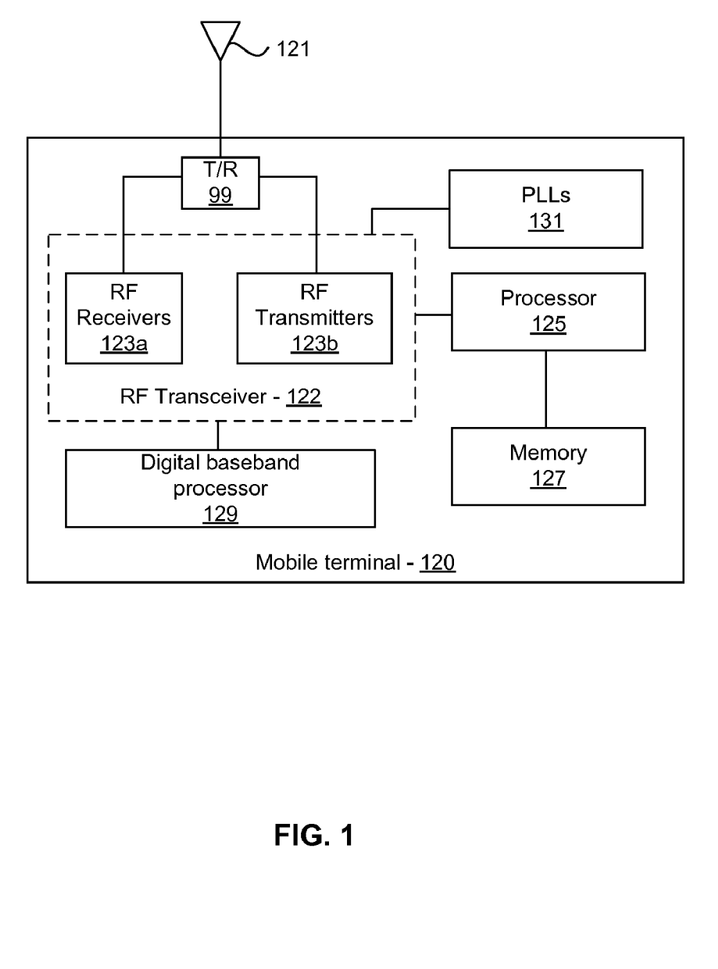
FIG. 1 is a block diagram of an exemplary mobile terminal that may utilize WCDMA power amplifier closed loop power control, in accordance with an embodiment of the invention.

FIG. 1 is a block diagram of an exemplary mobile terminal that may utilize WCDMA power amplifier closed loop power control, in accordance with an embodiment of the invention. Referring to FIG. 1, there is shown a wireless terminal 120 that may comprise an RF receiver 123a, an RF transmitter 123b, a digital baseband processor 129, PLLs 131, a processor 125, and a memory 127. The wireless terminal 120 may enable communication via a cellular network (GSM/EDGE, WCDMA and/or LTE), a wireless local area network (WLAN) and a Bluetooth network, and may be enabled to receive and process GPS signals. In an embodiment of the invention, the RF receiver 123a and the RF transmitter 123b may be integrated into a single RF transceiver 122, for example. The RF receiver 123a and the RF transmitter 123b may be integrated into a single chip that comprises a cellular radio (GSM/EDGE, WCDMA and/or LTE), WLAN radio and a Bluetooth radio, for example. The single chip comprising cellular, WLAN and Bluetooth radios may be implemented utilizing a single CMOS substrate, for example.

One or more transmit and receive antennas, shown schematically by the antenna 121, may be communicatively coupled to the RF receiver 123a and the RF transmitter 123b. In this regard, the antenna 121 may enable WLAN and Bluetooth transmission and/or reception, for example. A switch or other device having switching capabilities may be coupled between the RF receiver 123a and RF transmitter 123b, and may be utilized to switch the antenna 121 between transmit and receive functions in instances where a single antenna may be used to transmit and receive. The wireless terminal 120 may be operated in a system, such as a Wireless Local Area Network (WLAN), a cellular network, such as Long Term evolution (LTE), W-CDMA, and/or GSM, a digital video broadcast network, and/or a Wireless Personal Area Network (WPAN) such as a Bluetooth network, for example. In this regard, the wireless terminal 120 may support a plurality of wireless communication protocols, including the IEEE 802.11g/n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise an RF transceiver, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise an RF transceiver, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable execution of applications that may be utilized by the wireless terminal 120. For example, the processor 125 may generate at least one control signal and/or may execute applications that may enable current and proposed WLAN communications and/or Bluetooth communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123*a* for receiving WLAN and/or Bluetooth signals in the appropriate frequency band.

The RF receiver 123*a* may comprise a low noise amplifier (LNA) that may be configurable for single-ended or differential mode. Similarly an on-chip balun may also be configurable for single-ended or differential mode. In this manner, the balun may be integrated on-chip as a load to the LNA, thereby improving the noise figure for the RF receiver 123*a*.

Aspects of the invention may enable supporting a plurality of wireless standards in a single integrated transceiver. In this regard, each of a transmit chain and a receive chain may be configurable to support Long Term evolution (LTE), W-CDMA, and GSM wireless standards. LTE technology capabilities may comprise orthogonal frequency division multiplexing (OFDM), multiple antenna (MIMO), bandwidth scalability, existing (I-XI) and new (XII-XIV) bands, FDD and TDD, for example. OFDM capability may provide robustness against multipath issues, ease of scheduling of time/frequency resources, and increased spectral efficiency.

MIMO technology may provide enhanced data rate and performance, and may comprise 1 Tx and 2 Rx antennas, for example. Bandwidth scalability may enable efficient operation in differently-size allocated spectrum bands which may comprise 1.4, 3, 5, 10, 15 and 20 MHz, for example.

Single carrier FDMA (SC-FDMA) may enable frequency domain generation (DFT-Spread OFDM) and scalable bandwidth and flexible scheduling. In an embodiment of the invention, SC-FDMA may utilize quantized phase shift keying (QPSK) and N-bit quantized amplitude modulation (N-QAM), for example.

Configurable components/portions of the RF receivers 123*a* may comprise LNA(s), mixer(s), RF filter(s), PLL(s), VCO(s), ADC(s), and baseband filter(s). The receive chain may be configured to optimize power consumption for a given standards (LTE, W-CDMA, GSM) and conditions (e.g. interference, signal strength).

Configurable components/portions of the RF transmitters 123*b* may comprise PA(s), mixer(s), RF filter(s), PLL(s), VCO(s), DAC(s), and baseband filter(s). The transmit chain may be configured to optimize power consumption for a given standard (LTE, W-CDMA, GSM) and condition (e.g. interference, signal strength). An exemplary way in which the transmit chain may be configured is to select between IQ modulation or polar modulation, for optimum signal strength or power usage, for example.

Since each supported communication standard may comprise different filtering requirements, the baseband filter or filters may be configured to enable communication by any of the supported standards. For example, for GSM a Butterworth filter may be utilized, for W-CDMA, a Chebyschev filter of 0.3 dB ripple may be utilized, and in LTE, a Chebyschev filter with 1 dB ripple may be utilized. Furthermore, the filter bandwidth requirements may be different. For GSM the bandwidth may be up to 300 kHz, in wideband CDMA up to 2 MHz, and in LTE the bandwidth may vary from 0.7 MHz to 10 MHz. Thus, there may be a plurality of different filter types and a plurality of different filter cutoff frequencies in the filter. In an exemplary embodiment of the invention, there may be three different filter types and eight different filter cutoff frequencies in the filter.

In an embodiment of the invention, the wireless terminal 120 may be enabled to operate at a continuous output power level. By utilizing real-time or slot-based closed loop power control, the output power may be maintained at a desired level with short-term and/or long-term environmental or other variations that may affect output power. An envelope detector may be operable to provide a signal for a feedback loop that may be utilized to control the gain in programmable gain amplifiers, for example.

Figure 2:
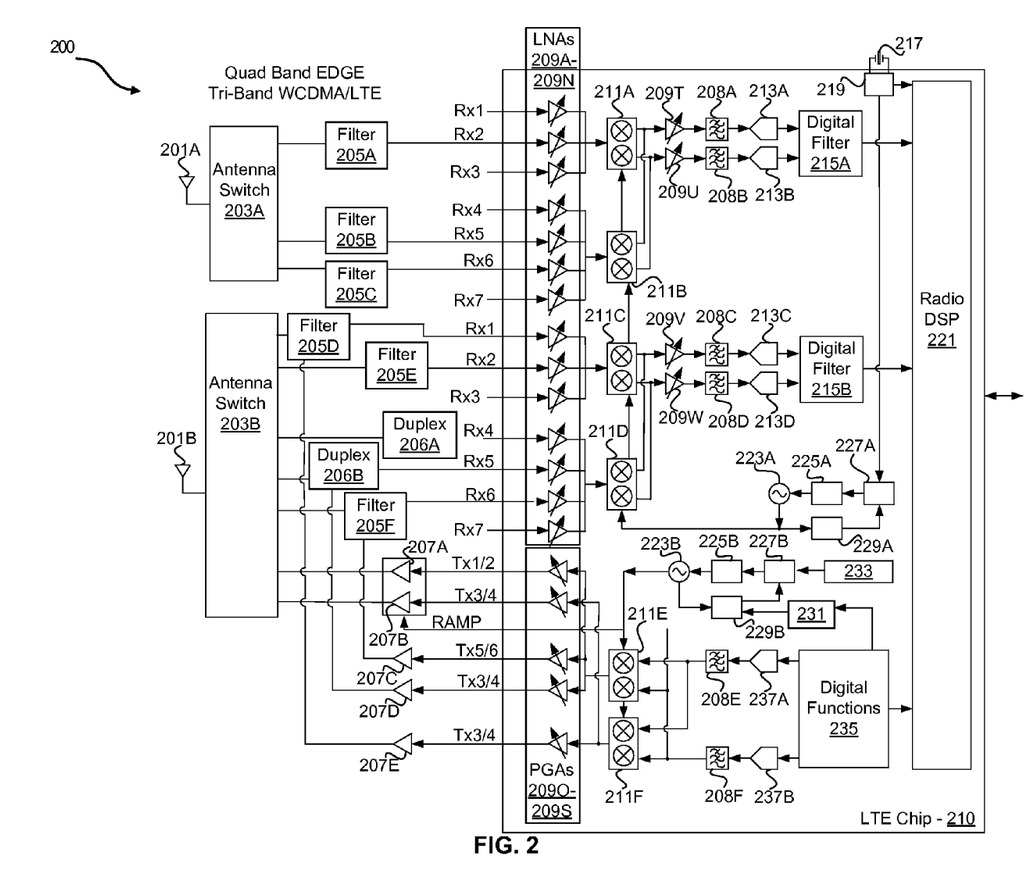
FIG. 2 is a block diagram illustrating an exemplary long term evolution (LTE) radio for providing WCDMA power amplifier closed loop power control, in accordance with an embodiment of the invention.

FIG. 2 is a block diagram illustrating an exemplary long term evolution (LTE) radio for providing WCDMA power amplifier closed loop power control, in accordance with an embodiment of the invention. Referring to FIG. 2, there is shown an LTE radio platform 200 comprising an LTE chip 210, antennas 201A and 201B, antenna switches 203A and 203B, filters 205A-205F, duplexers 206A-206B, amplifiers 207A-207E, and a crystal oscillator 217.

The LTE chip 210 may comprise low noise amplifiers (LNAs) 209A-209N, RF PGAs 209O-209S, mixers 211A-211F, filters 208A-208F, analog to digital converters (ADCs) 213A-213D, digital filters 215A and 215B, a crystal oscillator control block 219, a radio DSP 221, voltage controlled oscillators (VCOs) 223A and 223B, low pass filters 225A and 225B, phase-frequency detector (PFD)/charge pump (CP) blocks 227A and 227B, multi-modulus dividers (MMDs) 229A and 229B, a phase modulator 231, a reference PLL 233, a digital functions block 235, and digital to analog converters (DACS) 237A and 237B.

The antennas 201A and 201B may comprise electromagnetic signal transmit and/or receive capability, and may be enabled to transmit or receive RF signals that may be processed by the LTE chip 210. The antenna switches 203A and 203B may comprise suitable circuitry, logic, and/or code that may enable the selection of a path to be transmitted from the LTE chip 210 and/or to communicate a received signal to the LTE chip 210.

The filters 205A-205F and the baseband filters 208A-208F may comprise suitable circuitry, logic, and/or code that may enable filtering a received signal. In this manner, a signal of a desired frequency may be communicated through the filters 205A-205F and the baseband filters 208A-208F, while signals outside the desired frequency range may be attenuated. The baseband filters 208A-208F may be configurable, comprising stages that may be switched on and off, and may also be frequency-configurable, thus enabling multiband, multi-standard operation.

The duplexers 206A and 206B may comprise suitable circuitry, logic, and/or code that may enable simultaneous operation of Tx and Rx through a single path. The duplexers 206A and 206B may filter a Tx signal to the antenna and filter Rx signals from the antenna, and may also provide isolation between a chip comprising the Tx and Rx ports in a printed circuit board, for example.

The amplifiers 207A-207E may comprise suitable circuitry, logic, and/or code that may enable the amplification of a transmitted signal to a desired amplitude suitable for transmission via the antenna 201B. The low noise amplifiers (LNAs) 209A-209N may comprise suitable circuitry, logic, and/or code that may enable the amplification of a received signal, and may be configured to a desired gain level depending on the requirements of the standard being utilized for RF communication and desired noise figure. The RF PGAs 209O-209S may comprise suitable circuitry, logic, and/or code that may enable the amplification of a transmit signal and may provide an interface to components external to the LTE chip 210.

The mixers 211A-211F may comprise suitable circuitry, logic, and/or code that may enable up-conversion of a baseband or intermediate frequency signal to an RF frequency and/or down-conversion from an RF frequency to an intermediate or baseband frequency. The mixers 211A-211F may receive as inputs a signal to be converted and a local oscillator signal that may enable frequency conversion via the generation of sum and difference signals with the undesired signal subsequently being filtered out, leaving a signal at a desired frequency.

The ADCs 213A-213D may comprise suitable circuitry, logic, and/or code that may be enabled to receive an analog signal and generate a digital output signal. The DACs 237A and 237B may comprise suitable circuitry, logic, and/or code that may be enabled to receive a digital signal and generate an analog output signal.

The digital filters 215A and 215B may comprise suitable circuitry, logic, and/or code that may enable channel match filtering, de-rotation, and/or digital filtering of a received signal in the digital domain. In this manner, undesired signals generated by the ADCs 213A and 213B may be removed before communicating a signal to the radio DSP 221.

The crystal oscillator 217 may comprise a crystal that oscillates at a characteristic frequency determined by the material in the crystal. The crystal oscillator control block 219 may comprise suitable circuitry, logic, and/or code that may control the crystal oscillator 217. The crystal oscillator control block 219 may receive a signal at a characteristic frequency from the crystal oscillator 217, amplify the signal, and communicate the amplified feedback signal back to the crystal oscillator 217. In this manner, a stable clock signal may be generated at the characteristic frequency of the crystal oscillator 217.

The radio DSP 221 may comprise suitable circuitry, logic, and/or code that may enable the processing of digital signals via arbitrary functionality defined by user preferences and/or programming. The digital signals may comprise baseband signals, for example, and may represent information to be transmitted via the antenna 201B and/or received by the antenna 201A.

The VCOs 223A and 223B may comprise suitable circuitry, logic, and/or code that may be enabled to generate an output signal at a desired frequency as defined by an input voltage. The frequency of oscillation may be configured by varying the input voltage.

The LPFs 225A and 225B may comprise suitable circuitry, logic, and/or code that may be enabled to filter out higher frequency signals while allowing lower frequency signals to pass. The LPFs 225A and 225B may comprise feedback loops in PLLs to enable error correction and frequency lock of the PLLs. The input signals to the PLLs may comprise the crystal oscillator 217 and the reference PLL 233, for example.

The PFD/CP blocks 227A and 227B may comprise suitable circuitry, logic, and/or code that may be enabled to generate an error signal from a reference signal and a feedback signal received from a frequency divider, such as the MMDs 229A and 229B. The error signal may be communicated to the LPFs 225A and 225B before being communicated to the VCOs 223A and 223B to adjust the frequency generated.

The MMDs 229A and 229B may comprise suitable circuitry, logic, and/or code that may be enabled to divide the frequency of a signal received from the VCOs 223A or 223B. The divided frequency signal may be communicated to the PFD/CP blocks 227A and 227B to generate an error signal for frequency locking of the VCOs 223A and 223B.

The phase modulator 231 may comprise suitable circuitry, logic, and/or code that may be enabled to modulate the phase of a signal generated from a signal received from the digital functions block 235. In this manner, the phase of the LO signal generated by the VCO 223B may be configurable.

The reference PLL 233 may comprise suitable circuitry, logic, and/or code that be enabled to generate a signal at a desired frequency. The output signal may be communicated to the PFD/CP block 227B to provide a reference LO signal for configuring the VCO 223B.

The digital functions block 235 may comprise suitable circuitry, logic, and/or code that may perform specific digital functions on digital baseband signals before communicating them to the DACs 237A and 237B or the phase modulator 231. The digital functions may comprise, channel match filtering, cordic, and calibrations, for example.

In operation, the LTE radio platform 200 may comprise support for bands I through XIV and also additional standards such as HSPA+, HSPA, UMTS, and GSM/EDGE, for example. Additionally, a WCDMA/LTE system may support up to three bands using dedicated WCDMA/LTE Tx outputs or up to five bands, with multi-mode power amplifier (PA) support, for example. Similarly, the LTE radio platform 200 may support quad-band GSM/EDGE transmit and receive, LTE/WCDMA diversity with 2Rx/1Tx path, as well as FDD and TDD operation. In the Tx, bands V, VI, and VIII, may be supported, for example, with multi-mode outputs (GSM/EDGE/WCDMA on a single output) and also separate outputs. On the Rx side, new bands such as VII, XI, XIII, and XIV, for example, may also be supported with Rx diversity utilizing a single Rx VCO. Additionally, the Rx may enable linearity on demand, Tx leakage mitigation, and no Tx or Rx interstage filters or external LNAs. Similarly, reduced supply voltage may be enabled (2.3-2.5 V, for example) to support improved battery technology.

In an embodiment of the invention, the LTE radio platform 200 may be enabled to operate at a continuous output power level. By utilizing real-time or slot-based closed loop power control, the output power may be maintained at a desired level with short-term and/or long-term environmental or other variations that may affect output power. An envelope detector may provide a signal for a feedback loop that may be utilized to control the gain in programmable gain amplifiers, for example.

Figure 3:
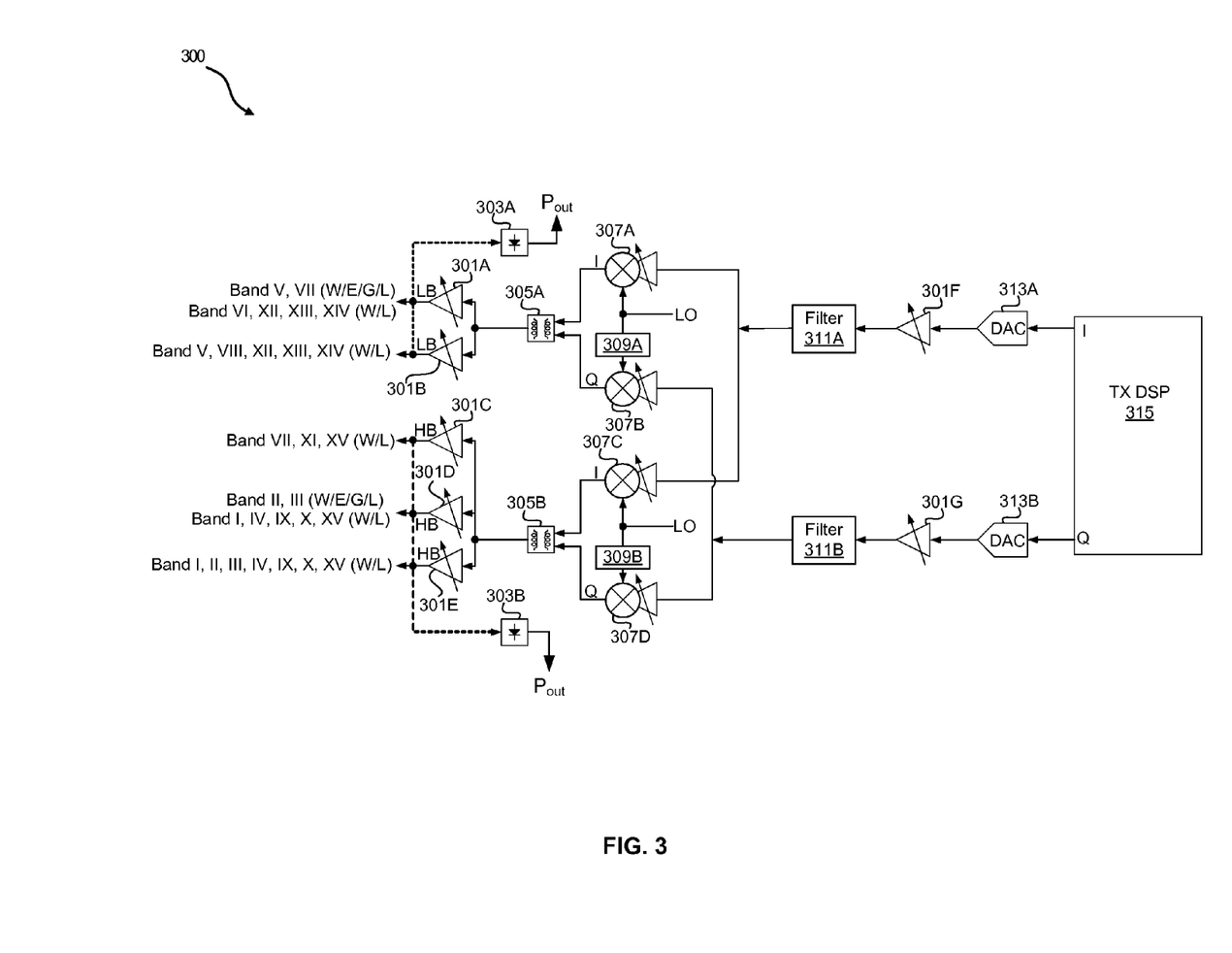
FIG. 3 is a block diagram illustrating an exemplary transmit architecture that may enable WCDMA power amplifier closed loop power control, in accordance with an embodiment of the invention.

FIG. 3 is a block diagram illustrating an exemplary transmit architecture that may enable WCDMA power amplifier closed loop power control, in accordance with an embodiment of the invention. Referring to FIG. 3, there is shown a multi-standard Tx 300 comprising RF PGAs 301A-301G, envelope detectors 303A and 303B, baluns 305A and 305B, mixer/PGAs 307A-307D, 90 degree phase blocks 309A and 309B, filters 311A and 311B, DACs 313A and 313B, and a Tx DSP 315.

The RF PGAs 301A-301E, baseband PGAs 301G-301F, and the DACs 313A and 313B may be substantially similar to the amplifiers 207A-207E and the DACs 237A and 237B described with respect to FIG. 2.

The envelope detectors 303A and 303B may comprise diodes, for example, that may enable the detection of the envelope function of the amplified signals at the outputs of the RF PGAs 301A-301E. In this manner, the output power of the multi-standard Tx 300 may be determined, thereby enabling the control of output power via feedback to RF PGAs.

The baluns 305A and 305B may comprise transformers that may be enabled to transform a balanced signal to an unbalanced signal for transmission via an antenna, for example.

The mixer/PGAs 307A-307D may comprise suitable circuitry, logic, and/or code that may enable to up-convert a baseband or IF signal to an RF signal and apply a configurable gain. The mixer/PGAs 307A-307D may receive as inputs an LO signal and a baseband/IF signal to be upconverted.

The mixer/PGAs 307A-307D may comprise IQ upconverters for WCDMA/LTE, IQ/Polar for EDGE and direct (PLL) modulation for GSM. The architecture may comprise multimode outputs, such as WCDMA/LTE and GSM/EDGE, for example, at the same outputs, which may enable flexible front-end configuration via multi-standard PAs, legacy PAs, and polar PAs for EDGE.

The 90 degree phase blocks 309A and 309B may comprise suitable circuitry, logic, and/or code that may be enabled to provide a phase shift, 90 degrees for example, to a received signal. In this manner, I and Q mixers may receive LO signals from the same source, with one being shifted by 90 degrees.

The filters 311A and 311B may comprise lowpass filters, for reconstruction and smoothing, for example, and may be enabled to filter signals with frequencies outside of a desired band and to allow signals with frequencies within the desired band. The filters 311A and 311B may be configurable filters with a plurality of stages, each of which may be activated or deactivated depending on the type and operational characteristics of the filter desired. For example, a 5th order Chebyshev filter with 1 dB ripple may be utilized for LTE, whereas a 3rd order Butterworth filter may be utilized for GSM/EDGE. In this manner, multiple wireless standards may be transmitted by the same Tx path.

The Tx DSP 315 may comprise suitable circuitry, logic, and/or code that may enable the processing of digital signals via arbitrary functionality defined by user preferences and/or programming. The digital signals may comprise baseband signals, for example, and may represent information to be transmitted via an antenna via the multi-standard Tx 300.

In operation, baseband signals may be processed by the Tx DSP 315 which may generate I and Q signals to be communicated to the DACs 313A and 313B, respectively. The DACs 313A and 313B may convert the received signals to analog signals before communicating them to the baseband PGAs 301F and 301G, which may apply gain to the received signals.

The amplified signals may then be communicated to the filters 311A and 311B where unwanted signals may be filtered out before the desired signals may be communicated to the mixer/PGAs 307A-307D. The filtered signals may then be upconverted to RF signals via the LO signals received by the mixer/PGAs 307A-307D. Each of the mixer/PGAs 307A-307D may upconvert an I or Q signal with an I and a Q signal being communicated to each of the baluns 305A and 305B, which may convert the received signals to an unbalanced signal. The converted signals may be communicated to the RF PGAs 301A-301E. The RF PGAs 301A-301E may be activated to amplify the desired signal, depending on which standard and/or frequency band may be utilized.

In an embodiment of the invention, the multi-standard Tx 300 may be enabled to operate at a continuous output power level. By utilizing real-time or slot-based closed loop power control, the output power may be maintained at a desired level with short-term and/or long-term environmental or other variations that may affect output power. An envelope detector may provide a signal for a feedback loop that may be utilized to control the gain in programmable gain amplifiers, for example.

Figure 4:
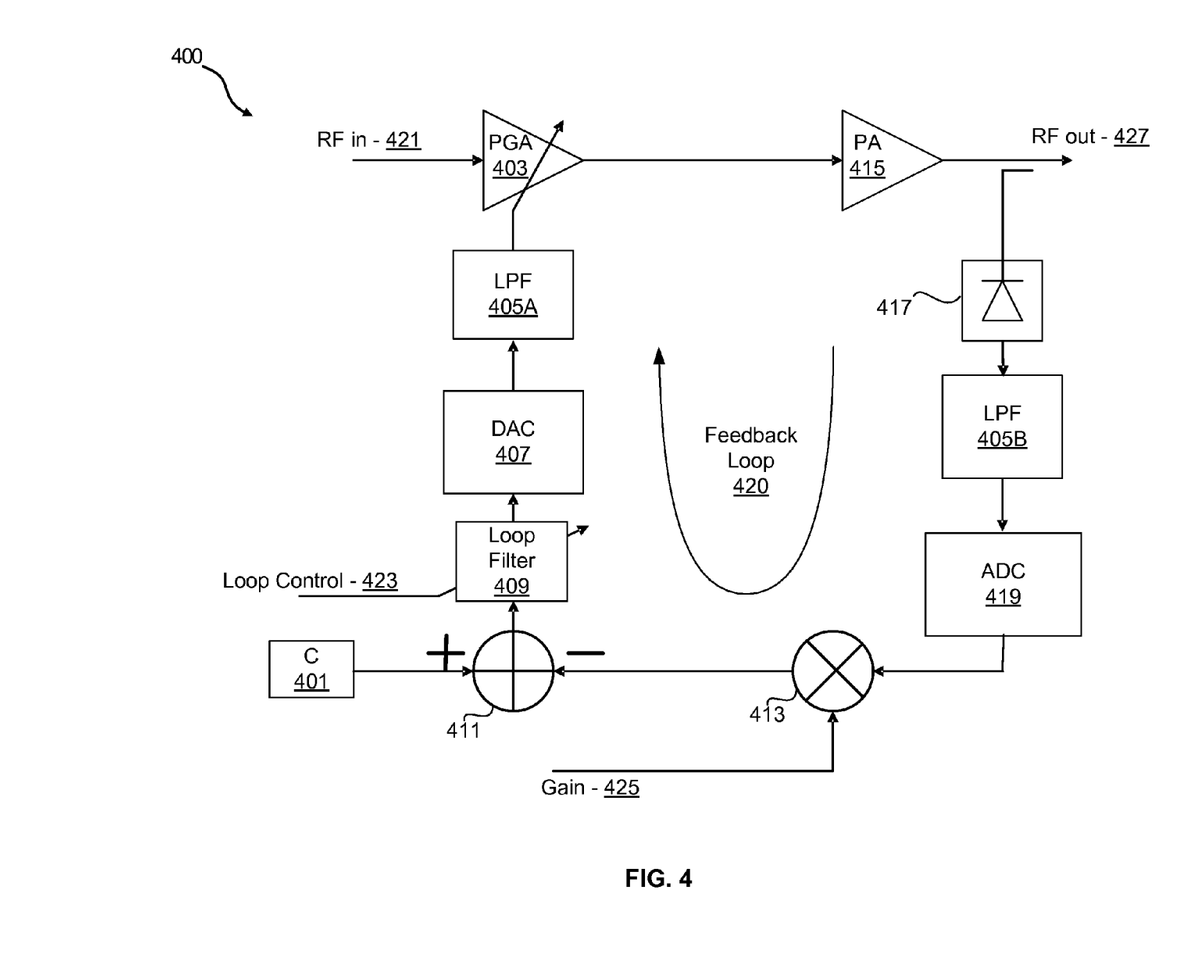
FIG. 4 is a block diagram illustrating an exemplary real time gain control configuration, in accordance with an embodiment of the invention.

FIG. 4 is a block diagram illustrating an exemplary real time gain control configuration, in accordance with an embodiment of the invention. Referring to FIG. 4, there is shown a real time gain control configuration 400 comprising a control block 401, a programmable gain amplifier (PGA) 403, low pass filters (LPFs) 405A and 405B, a DAC 407, a loop filter 409, an adder 411, a multiplier 413, a power amplifier (PA) 415, an envelope detector 417, and an ADC 419. There is also shown a feedback loop 420, an RF input signal 421, a loop control signal 423, a gain signal 425, and an RF out signal 427.

The control block 401 may comprise suitable circuitry, logic, and/or code that may be enabled to generate a control signal for a desired output power for the RF out signal 427. The output of the control block 401 may be communicatively coupled to an input of the adder 411.

The PGA 403 may comprise suitable circuitry, logic, and/or code that may be enabled to amplify a received signal with a desired gain level, +/−3 dB, for example. The PGA 403 may receive as inputs, the RF input signal 421 and a control signal received from the LPF 405A. The output of the PGA 403 may be communicatively coupled to an input of the PA 415.

The LPFs 405A and 405B may comprise suitable circuitry, logic, and/or code that may be enabled to filter out received signals above a configurable frequency while allowing signals to pass with a frequency below the configurable frequency.

The DAC 407 may comprise suitable circuitry, logic, and/or code that may be enabled to convert a received digital input signal into an analog output signal. The input of the DAC 407 may be communicatively coupled to the output of the loop filter 409, and the output of the DAC 407 may be communicatively coupled to an input of the LPF 405A.

The loop filter 409 may comprise suitable circuitry, logic, and/or code that may be enabled to provide an error signal to enable control of the PGA 403 via the feedback loop 420. The parameters of the control enabled by the feedback loop 420 may be configured to determine how fast or slow the feedback control may react to output power changes, for example. The loop filter 409 may receive as inputs the output of the adder 411 and the loop control signal 423. The output of the loop filter 409 may be communicatively coupled to the DAC 407.

The adder 411 may comprise suitable circuitry, logic, and/or code that may be enabled to receive input signals and generate an output signal that is the sum of the inputs, or the subtraction of inputs in the case of negative inputs. The adder 411 may receive as inputs the output signals of the control block 401 and the multiplier 413, whereas the input from the multiplier 413 may be a negative input. In this manner the signal received from the multiplier 413 may be subtracted from the input from the control block 401 to generate the output signal that may be communicated to the loop filter 409.

The multiplier 413 may comprise suitable circuitry, logic, and/or code that may be enabled to generate an output signal that is the result of multiplying the input signals. Accordingly, the multiplier 413 may receive as inputs the gain signal 425 and the output signal generated by the ADC 419. The output of the multiplier 413 may be communicatively coupled to the adder 411.

The PA 415 may comprise suitable circuitry, logic, and/or code that may be enabled to amplify a received input signal and generate an output signal, the RF output signal 427.

The envelope detector 417 may comprise suitable circuitry, logic, and/or code that may be enabled to sense the amplitude modulation of an RF signal, the RF output signal 427, to provide a feedback signal for gain control of the PGA 403 via the feedback loop 420. The envelope detector 417 may comprise a diode, for example, and may generate an output signal proportional to the RF output signal 427 that may be communicated to the LPF 405B. In another embodiment of the invention, the envelope detector 417 may comprise a directional coupler.

The ADC 419 may comprise suitable circuitry, logic, and/or code that may be enabled to convert a received analog input signal and generate a digital output signal. The output of the ADC 419 may be communicatively coupled to the multiplier 413.

In operation, an RF input signal 421 may be communicated to the PGA 403, the output of which may be communicated to the PA 415 that may generate the RF output signal 427. The envelope detector 417 may monitor the RF output signal 427 by measuring the average voltage generated by the PA 415. The signal generated by the envelope detector 417 may be communicated to the LPF 405B which may filter out the high frequency noise. The output signal of the LPF 405B may be communicated to the ADC 419, which may generate a digital output signal that may indicate the signal strength of the RF output signal 427. The digital signal generated by the ADC 419 may be multiplied by a gain signal 425 by the multiplier 413 before being communicated to the adder 411, where the multiplied signals may be subtracted from the signal generated by the control block 401.

The output signal of the adder 411 may be communicated to the loop filter 409, which may be configured by the loop control signal 423. In this manner, an error signal may be generated in the feedback loop 420 that may enable the control of the gain of the PGA 403 to offset any gain offsets or changes in the PA 415 due to reduced power supply levels, temperature, or other variations. The output of the loop filter 409 may be communicated to the DAC 407, converted to a digital signal, and communicated to the LPF 405A to remove high frequency noise that may be generated by the DAC 407. The filtered signal may be utilized to control the gain of the PGA 403.

The control feedback loop described may comprise a real time, adaptive open loop control architecture, and may measure the magnitude of the RF output signal 427 on a continuous basis, and may adjust the gain of the PGA 403 to maintain a desired RF output signal 427 magnitude.

In instances where the power supply for the PA 415 may be reduced, to conserve power, for example, the gain of the PA 415 may be reduced, reducing the RF output signal 427 below a desired level. The feedback loop 420 may then be utilized to increase the gain of the PGA 403 to offset the reduced gain of the PA 415.

Figure 5:
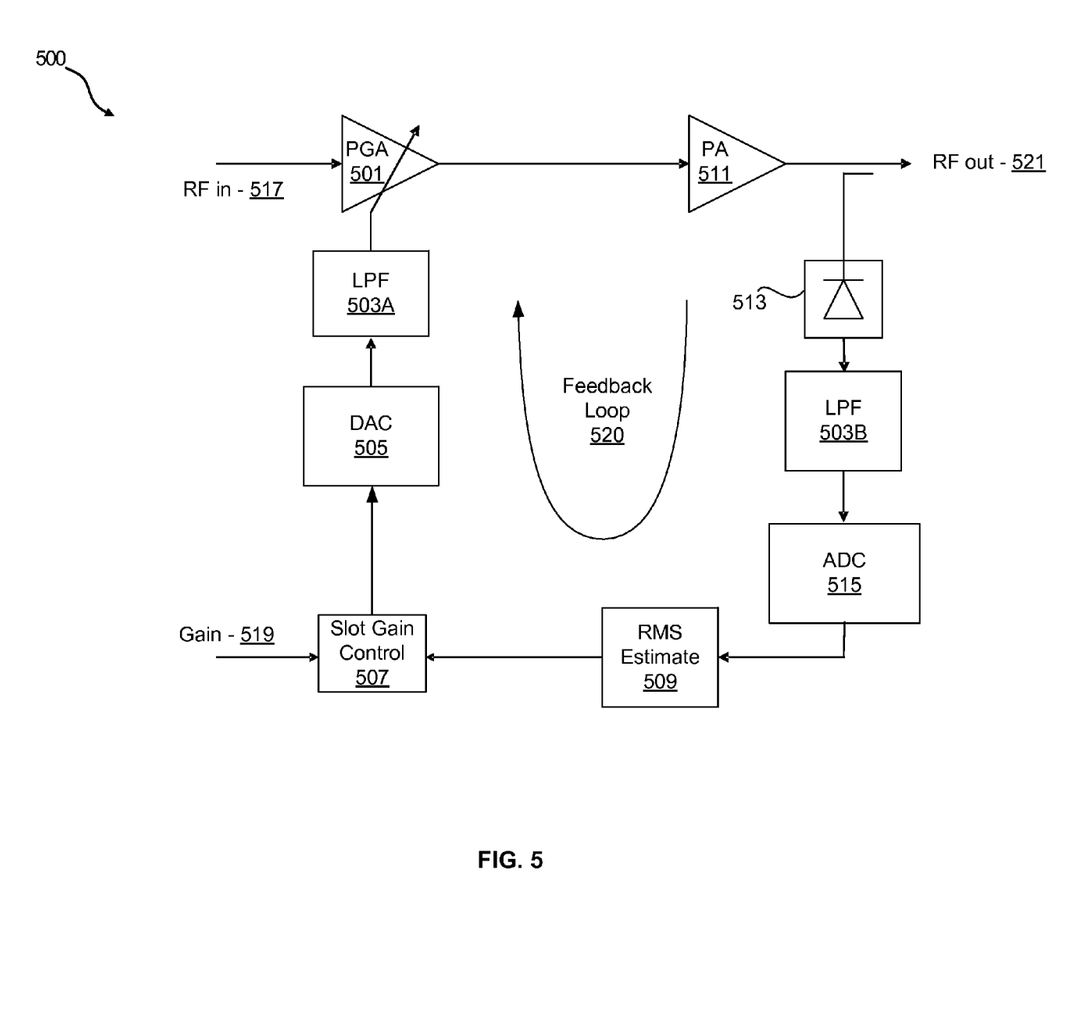
FIG. 5 is a block diagram illustrating an exemplary slot-based gain control configuration, in accordance with an embodiment of the invention.

FIG. 5 is a block diagram illustrating an exemplary slot-based gain control configuration, in accordance with an embodiment of the invention. Referring to FIG. 5, there is shown a slot-based gain control configuration 500 comprising a PGA 501, low pass filters (LPFs) 503A and 503B, a DAC 505, a slot gain control module 507, an RMS estimate block 509, a PA 511, an envelope detector 513, and an ADC 515. There is also shown a feedback loop 520, an RF input signal 517, a gain signal 519, and an RF out signal 521.

The PGA 501, the LPFs 503A and 503B, the DAC 505, the PA 511, the envelope detector 513, and the ADC 515 may be substantially similar to the PGA 403, the LPFs 405A and 405B, the DAC 407, the PA 415, the envelope detector 417, and the ADC 419 described with respect to FIG. 4.

The slot gain control module 507 may comprise suitable circuitry, logic, and/or code that may be enabled to generate a signal that may be utilized to control the gain of the PGA 501 via the DAC 505 and the LPF 503A. The slot gain control module 507 may receive as inputs a gain signal 519 and the output signal generated by the RMS estimate block 509.

The RMS estimate block 509 may comprise suitable circuitry, logic, and/or code that may be enabled to determine the root mean square value of a signal received from the ADC 515 over a time slot, which may comprise 666.7 microseconds, for example. The output signal, proportional to the RMS value of the received input signal may be communicatively coupled to the slot gain control module 507.

In operation, an RF input signal 517 may be communicated to the PGA 501, the output of which may be communicated to the PA 511 that may amplify the received signal generating the RF output signal 521. The envelope detector 513 may monitor the RF output signal 521 by measuring the voltage generated by the PA 511. The signal generated by the envelope detector 513 may be communicated to the LPF 503B which may filter out high frequency noise. The output signal of the LPF 503B may be communicated to the ADC 515, which may generate a digital output signal which may correspond to the signal strength of the RF output signal 521 as measured by the envelope detector 513.

The digital signal generated by the ADC 515 may be communicated to the RMS estimate block 509, which may determine an RMS value of the RF output signal 521 as measured by the envelope detector 513. The RMS value may be communicated to the slot gain control module 507 which may compare the RMS value to a desired output signal 521 signal strength, and generate an output signal that may be utilized to control the gain of the PGA 501. The output of the slot gain control module 507 may be communicated to the DAC 505 which may generate an analog signal from the received digital signal. The analog signal generated by the DAC 505 may be communicated to the LPF 503A which may filter out high frequency noise in the output signal of the DAC 505. The filtered signal may be communicated to the PGA 501, and may adjust the gain of the PGA 501. In this manner, a constant output power for the RF output signal 521 may be maintained.

Slot-based control may be utilized for slow varying phenomena, in that an output power may be measured during a slot, and the gain of the PGA 501 may be adjusted near the end of the slot or the beginning of the next slot, for example. This technique may be suitable for controlling changes in output power due to decreasing battery level, temperature changes, or other variations with a longer period of variation.

Figure 6:
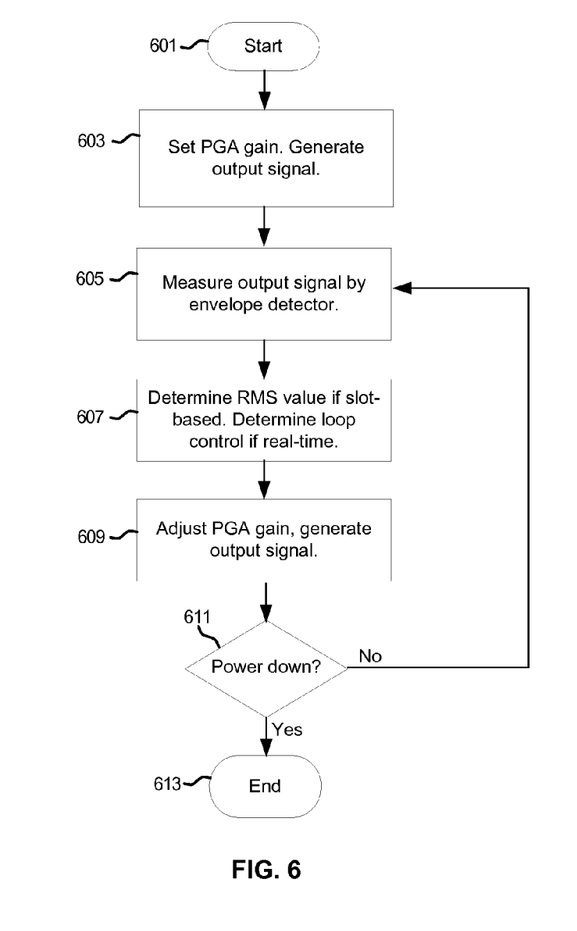
FIG. 6 is a flow diagram illustrating exemplary steps enabling WCDMA power amplifier closed loop power control, in accordance with an embodiment of the invention.

FIG. 6 is a flow diagram illustrating exemplary steps enabling WCDMA power amplifier closed loop power control, in accordance with an embodiment of the invention. In step 603, after start step 601, the PGA gain may be set and an RF output signal 427/521 may be generated by the PA 415/511, followed by step 605, where the magnitude of the RF output signal 427/521 may be measured utilizing the envelope detector 417/513. In step 607, if utilizing slot-mode, an RMS value of the magnitude of the RF output signal 521 may be determined by the RMS estimate block 509, and if in real time mode, an error signal may be generated utilizing a loop control signal 423 by comparing the measured RF output signal 427 to a desired magnitude. In step 609, the PGA 403/501 gain may be adjusted, generating the RF output signal 427/521 at a desired signal strength. In step 611, if the mobile terminal 120 is to be powered down, the exemplary steps may proceed to end step 613, and if not, may proceed back to step 605.

In an exemplary embodiment of the invention, a method and system is disclosed for determining a magnitude of an output RF signal 427/521 generated by a power amplifier (PA) 415/511, and configuring a gain of a PGA 403/501 coupled to an input of the PA 415/511 via closed-loop feedback to maintain a desired magnitude of the output RF signal 427/521. The closed-loop feedback architecture may include a slot-based and/or a real time-based control. The closed-loop feedback architecture may comprise a slot-based control 500 and/or a real time-based control 400 of the magnitude of the output RF signal 427/521. A signal that is proportional to the magnitude of the output RF signal 427/521 may be generated by an envelope detector 417/513, which may comprise a diode. The signal generated by the envelope detector 513 may be filtered and may be utilized to generate a root-mean-squared (RMS) value. The gain of the PGA 501 may be configured by comparing the RMS value to a desired magnitude of the RF output signal 427/521 over a time slot. A real time error signal may be generated by subtracting the signal proportional to the magnitude of the output RF signal 427/521 from a desired magnitude of the output RF signal. The gain of the PGA 403 may be configured utilizing the real time error signal.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for WCDMA power amplifier closed loop power control.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
in a wireless transmitter:
determining a magnitude of an output RF signal generated from a power amplifier; and
configuring a gain of a PGA coupled to an input of said power amplifier via closed-loop feedback to maintain a desired magnitude of said output RF signal, wherein said closed loop feedback comprises a slot-based control of said magnitude of said output RF signal.

2. The method according to claim 1, wherein said closed loop feedback comprises a real time-based control of said magnitude of said output RF signal.

3. The method according to claim 1, comprising generating a signal proportional to said magnitude of said output RF signal via an envelope detector.

4. The method according to claim 3, comprising filtering said generated signal that is proportional to said magnitude of said output RF signal.

5. The method according to claim 3, comprising generating a root-mean-squared (RMS) value of said generated signal that is proportional to said magnitude of said output RF signal.

6. The method according to claim 5, comprising:
comparing said generated RMS value to a desired magnitude of said RF output signal over a time slot; and
configuring said gain of said PGA based on said comparison.

7. The method according to claim 3, comprising generating a real time error signal by subtracting said signal proportional to said magnitude of said output RF signal from a desired magnitude of said output RF signal.

8. The method according to claim 7, comprising configuring said gain of said PGA utilizing said generated real time error signal.

9. The method according to claim 3, wherein said envelope detector comprises a diode.

10. A system for processing signals, the system comprising:
one or more circuits for use in a wireless transmitter, wherein said one or more circuits comprise a power amplifier and a programmable gain amplifier, and said one or more circuits are operable to determine a magnitude of an output RF signal generated from said power amplifier; and
said one or more circuits are operable to configure a gain of said PGA coupled to an input of said power amplifier via closed-loop feedback to maintain a desired magnitude of said output RF signal, wherein said closed loop feedback comprises a slot-based control of said magnitude of said output RF signal.

11. The system according to claim 10, wherein said closed loop feedback comprises real time-based control of said magnitude of said output RF signal.

12. The system according to claim 10, wherein said one or more circuits comprise an envelope detector, and said one or more circuits are operable to generate a signal proportional to said magnitude of said output RF signal via an envelope detector.

13. The system according to claim 12, wherein said one or more circuits are operable to filter said generated signal that is proportional to said magnitude of said output RF signal.

14. The system according to claim 12, wherein said one or more circuits are operable to generate a root-mean-squared (RMS) value of said generated signal that is proportional to said magnitude of said output RF signal.

15. The system according to claim 14, wherein said one or more circuits are operable to:
compare said generated RMS value to a desired magnitude of said RF output signal over a time slot; and
configure said gain of said PGA based on said comparison.

16. The system according to claim 12, wherein said one or more circuits are operable to generate a real time error signal by subtracting said signal proportional to said magnitude of said output RF signal from a desired magnitude of said output RF signal.

17. The system according to claim 16, wherein said one or more circuits are operable to configure said gain of said PGA utilizing said generated real time error signal.

18. The system according to claim 12, wherein said envelope detector comprises a diode.

19. A method for processing signals, the method comprising:
in a wireless transmitter:
determining a magnitude of an output RF signal generated from a power amplifier;
configuring a gain of a PGA coupled to an input of said power amplifier via closed-loop feedback to maintain a desired magnitude of said output RF signal; and
generating a signal proportional to said magnitude of said output RF signal via an envelope detector.

20. The method according to claim 19, wherein said closed loop feedback comprises a real time-based control of said magnitude of said output RF signal.

21. The method according to claim 19, comprising filtering said generated signal that is proportional to said magnitude of said output RF signal.

22. The method according to claim 19, comprising generating a root-mean-squared (RMS) value of said generated signal that is proportional to said magnitude of said output RF signal.

23. The method according to claim 19, comprising generating a real time error signal by subtracting said signal proportional to said magnitude of said output RF signal from a desired magnitude of said output RF signal.

24. The method according to claim 19, wherein said envelope detector comprises a diode.

25. A system for processing signals, the system comprising:
one or more circuits for use in a wireless transmitter, wherein said one or more circuits comprise a power amplifier and a programmable gain amplifier, and said one or more circuits are operable to determine a magnitude of an output RF signal generated from said power amplifier;
said one or more circuits are operable to configure a gain of said PGA coupled to an input of said power amplifier via closed-loop feedback to maintain a desired magnitude of said output RF signal; and
said one or more circuits comprise an envelope detector, and wherein said one or more circuits are operable to generate a signal proportional to said magnitude of said output RF signal via an envelope detector.

26. The method according to claim 25, wherein said closed loop feedback comprises real time-based control of said magnitude of said output RF signal.

27. The method according to claim 25, wherein said one or more circuits are operable to filter said generated signal that is proportional to said magnitude of said output RF signal.

28. The method according to claim 25, wherein said one or more circuits are operable to generate a root-mean-squared (RMS) value of said generated signal that is proportional to said magnitude of said output RF signal.

29. The method according to claim 25, wherein said one or more circuits are operable to generate a real time error signal by subtracting said signal proportional to said magnitude of said output RF signal from a desired magnitude of said output RF signal.

30. The method according to claim 25, wherein said envelope detector comprises a diode.

\* \* \* \* \*